United States Patent
Dani et al.

(10) Patent No.: US 12,068,749 B2
(45) Date of Patent: *Aug. 20, 2024

(54) BIDIRECTIONAL RF CIRCUIT AND METHOD OF USE

(71) Applicant: Reach Power, Inc., Redwood City, CA (US)

(72) Inventors: Asmita Dani, Redwood City, CA (US); Christopher Joseph Davlantes, Redwood City, CA (US)

(73) Assignee: Reach Power, Inc., Redwood City, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/203,810

(22) Filed: May 31, 2023

(65) Prior Publication Data

US 2023/0327651 A1 Oct. 12, 2023

Related U.S. Application Data

(63) Continuation of application No. 18/087,052, filed on Dec. 22, 2022, now Pat. No. 11,722,125.

(60) Provisional application No. 63/352,432, filed on Jun. 15, 2022, provisional application No. 63/292,932, filed on Dec. 22, 2021.

(51) Int. Cl.
| | |
|---|---|
| *H03K 3/01* | (2006.01) |
| *H02M 7/217* | (2006.01) |
| *H03F 3/19* | (2006.01) |
| *H03G 3/30* | (2006.01) |
| *H03K 3/012* | (2006.01) |

(52) U.S. Cl.
CPC ............ *H03K 3/012* (2013.01); *H02M 7/217* (2013.01); *H03F 3/19* (2013.01); *H03G 3/3036* (2013.01); *H03F 2200/451* (2013.01); *H03G 2201/103* (2013.01); *H03G 2201/307* (2013.01)

(58) Field of Classification Search
CPC ........ H03F 1/223; H03F 1/3205; H03F 1/342; H03F 3/195; H03F 2200/451; H03F 1/26; H03F 3/19
See application file for complete search history.

(56) References Cited

U.S. PATENT DOCUMENTS

| | | |
|---|---|---|
| 2003/0076172 A1 | 4/2003 | Tichauer |
| 2011/0165849 A1 | 7/2011 | Gorbachov |
| 2012/0306578 A1 | 12/2012 | Fast |
| 2013/0049735 A1 | 2/2013 | Shafer et al. |
| 2014/0152251 A1 | 6/2014 | Kim et al. |
| 2015/0091650 A1 | 4/2015 | Nobbe et al. |

(Continued)

*Primary Examiner* — Quan Tra
(74) *Attorney, Agent, or Firm* — Jeffrey Schox; Samuel Rosenthal

(57) ABSTRACT

A bidirectional RF circuit, preferably including a plurality of terminals, a switch, a transistor, a coupler, and a feedback network. The circuit can optionally include a drain matching network, an input matching network, and/or one or more tuning inputs. In some variations, the circuit can optionally include one or more impedance networks, such as an impedance network used in place of the feedback network; in some such variations, the circuit may not include a coupler, switch, and/or input matching network. A method for circuit operation, preferably including operating in an amplifier mode, operating in a rectifier mode, and/or transitioning between operation modes.

20 Claims, 9 Drawing Sheets

(56) References Cited

U.S. PATENT DOCUMENTS

2019/0296692 A1  9/2019 Patel et al.
2022/0077827 A1* 3/2022 Jiang ................. H03F 1/565

* cited by examiner

BIDIRECTIONAL RF CIRCUIT AND METHOD OF USE

CROSS-REFERENCE TO RELATED APPLICATIONS

This application is a continuation of U.S. patent application Ser. No. 18/087,052, filed on 22 Dec. 2022, which claims the benefit of U.S. Provisional Application Ser. No. 63/292,932, filed on 22 Dec. 2021, and of U.S. Provisional Application Ser. No. 63/352,432, filed on 15 Jun. 2022, each of which is incorporated in its entirety by this reference.

STATEMENT OF GOVERNMENT SUPPORT

This invention was made with government support under Contract Number HR0011210126 awarded by the Defense Advanced Research Projects Agency. The government has certain rights in the invention.

TECHNICAL FIELD

This invention relates generally to the radio frequency (RF) electronics field, and more specifically to a new and useful bidirectional RF circuit and method of use.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview.

Figure 1:
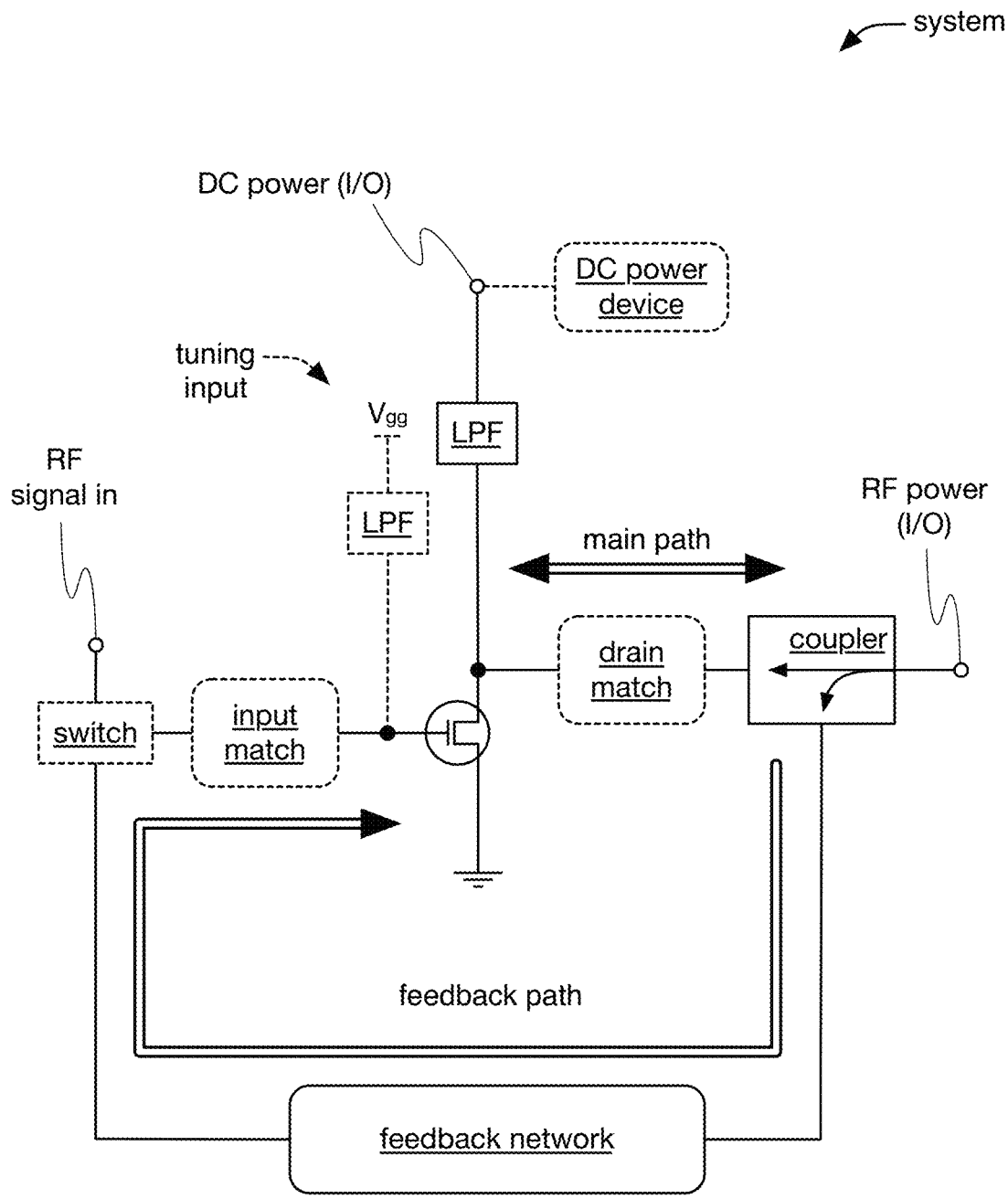
FIG. 1 is a schematic representation of an embodiment of a bidirectional RF circuit.
Figure 2A:
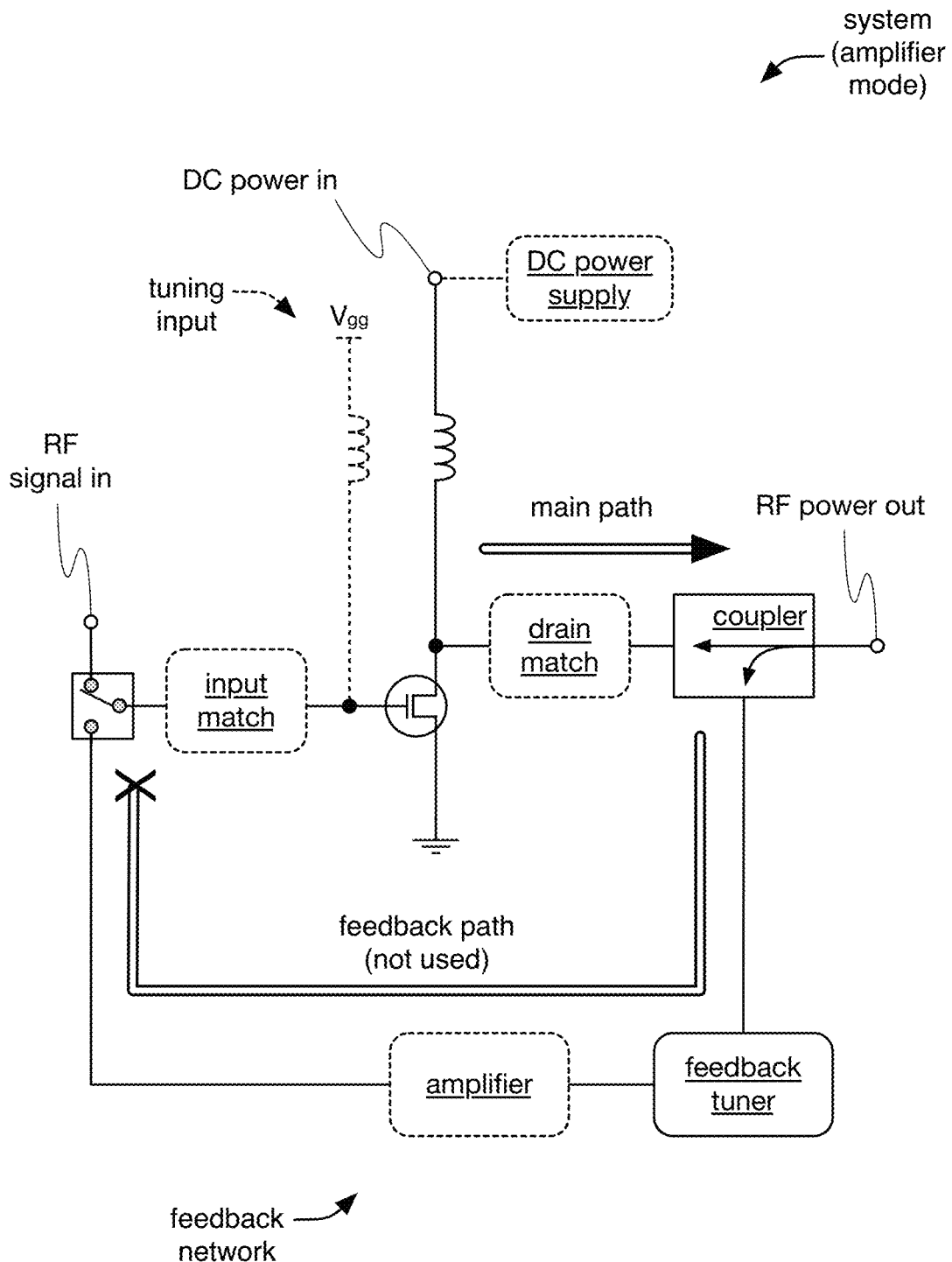
FIG. 2A is a schematic representation of an example of the circuit configured in an amplifier mode.
Figure 2B:
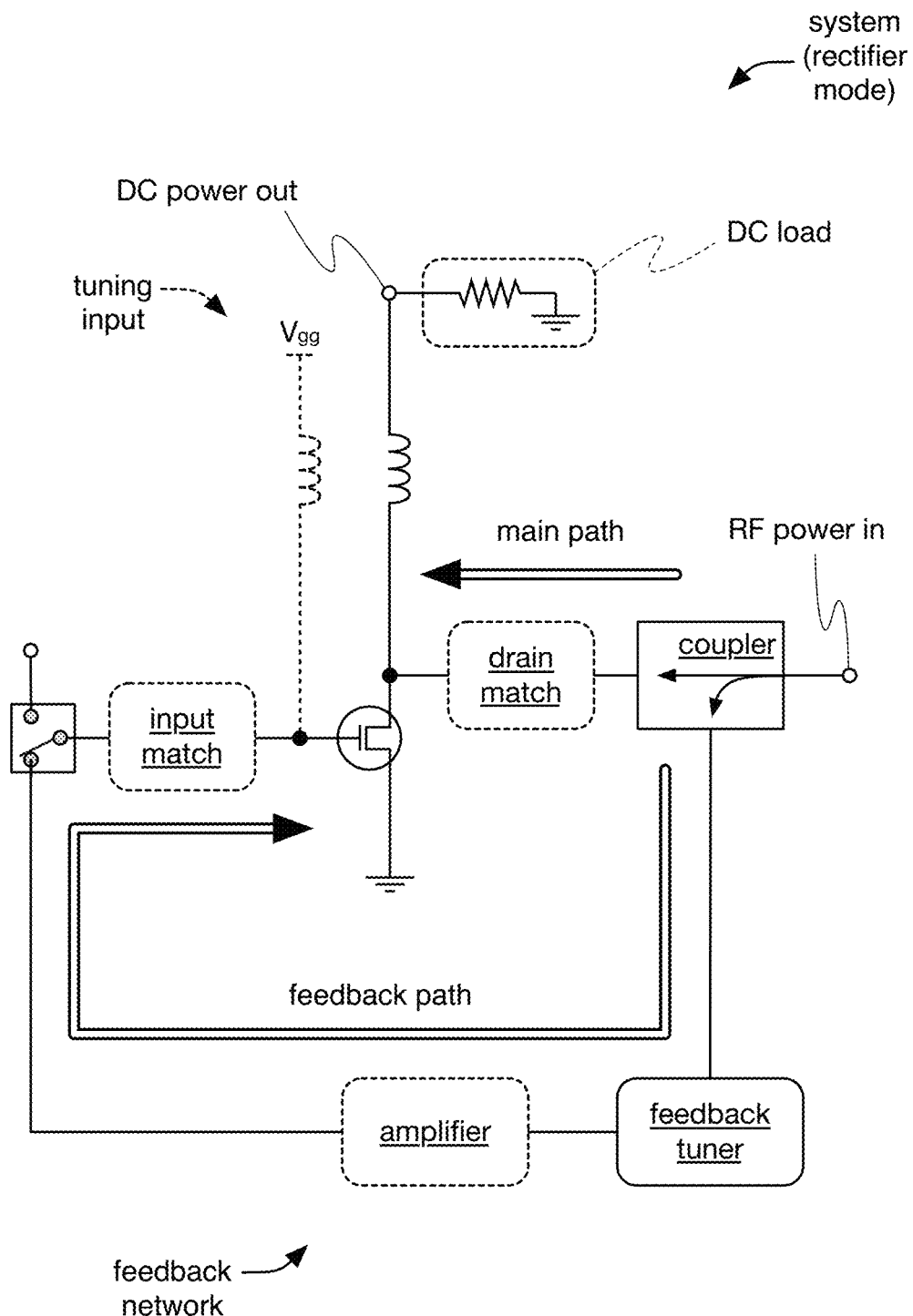
FIG. 2B is a schematic representation of an example of the circuit configured in a rectifier mode.
Figure 3:
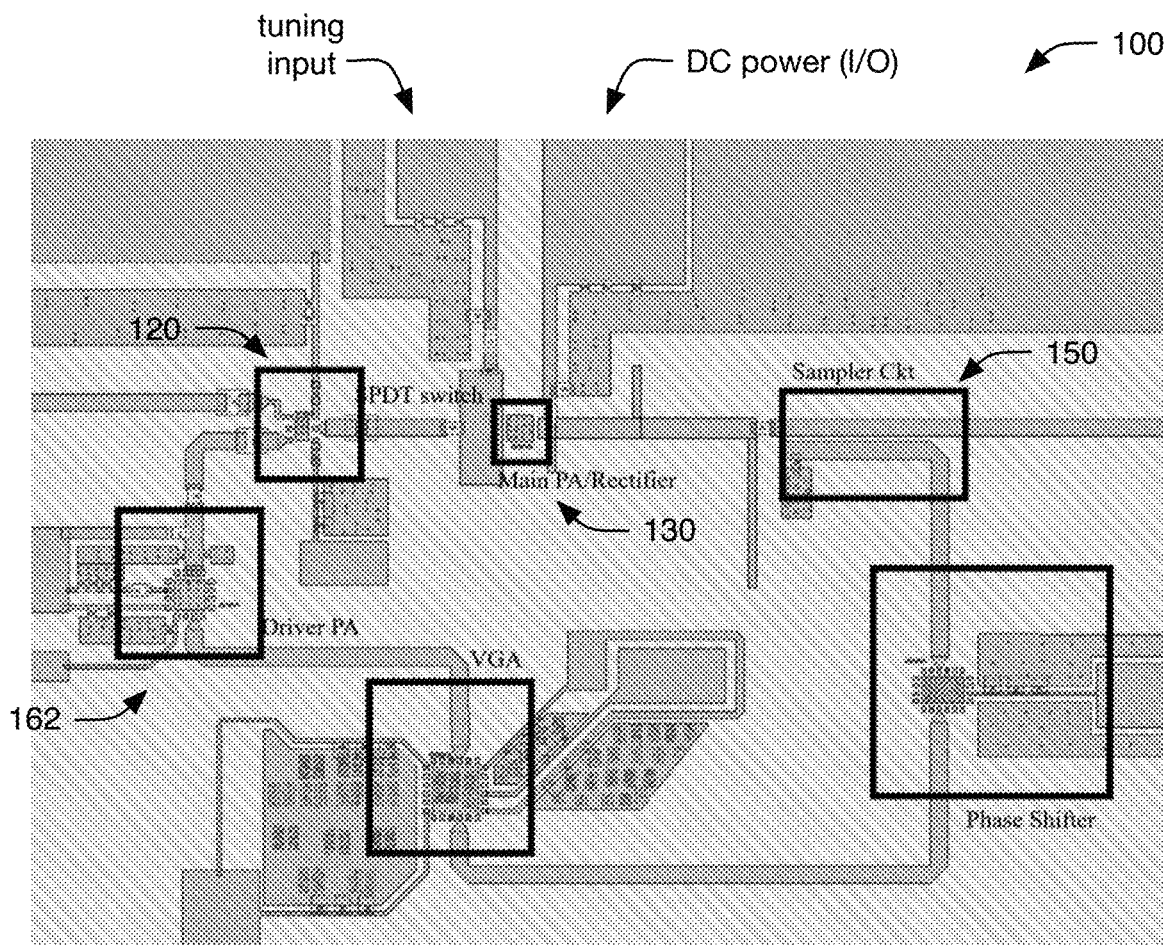
FIG. 3 is a plan view of a specific example of the circuit.

A bidirectional RF circuit 100 preferably includes a plurality of terminals 110, a switch 120, a transistor 130, a coupler 150, and a feedback network 160 (e.g., as shown in FIGS. 1, 2A, 2B, and/or 3). The circuit can optionally include a drain matching network 140, an input matching network 180, and/or one or more tuning inputs 190. In some variations, the circuit 100 can optionally include one or more impedance networks 170, such as an impedance network used in place of the feedback network 160; in some such variations, the circuit 100 may not include a coupler 150, switch 120, and/or input matching network 180, such as shown by way of examples in FIGS. 5A-5F. However, the circuit can additionally or alternatively include any other suitable elements.

Figure 4:
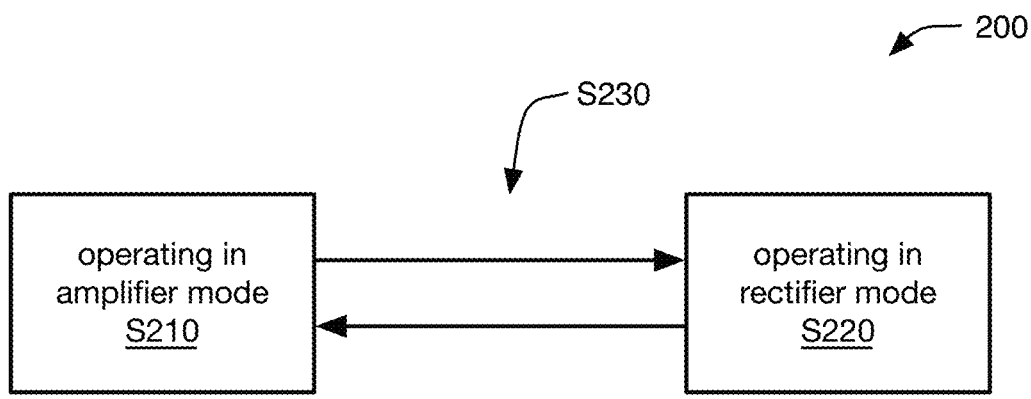
FIG. 4 is a schematic representation of an embodiment of a method of use for a bidirectional RF circuit.

A method 200 for circuit operation preferably includes operating in an amplifier mode S210, operating in a rectifier mode S220, and/or transitioning between operation modes S230 (e.g., as shown in FIG. 4). However, the method can additionally or alternatively include any other suitable elements.

2. Bidirectional RF Circuit.

The circuit 100 is preferably operable between an amplifier mode and a rectifier mode (e.g., in which an RF power input is rectified), more preferably wherein the circuit 100 can be controlled to transition its configuration between the amplifier mode the rectifier mode. In the amplifier mode, the circuit preferably functions as a power amplifier (e.g., amplifying an RF input signal and providing the amplified signal as an RF power output). In the rectifier mode, the circuit preferably functions as a synchronous rectifier (e.g., rectifying an RF power input and providing the rectified power as a DC power output). The circuit 100 preferably performs these functions (or alternatively, a subset thereof, such as amplification only or rectification only) with high efficiency (but can alternatively have any suitable amplification and/or rectification efficiency).

Figure 7:
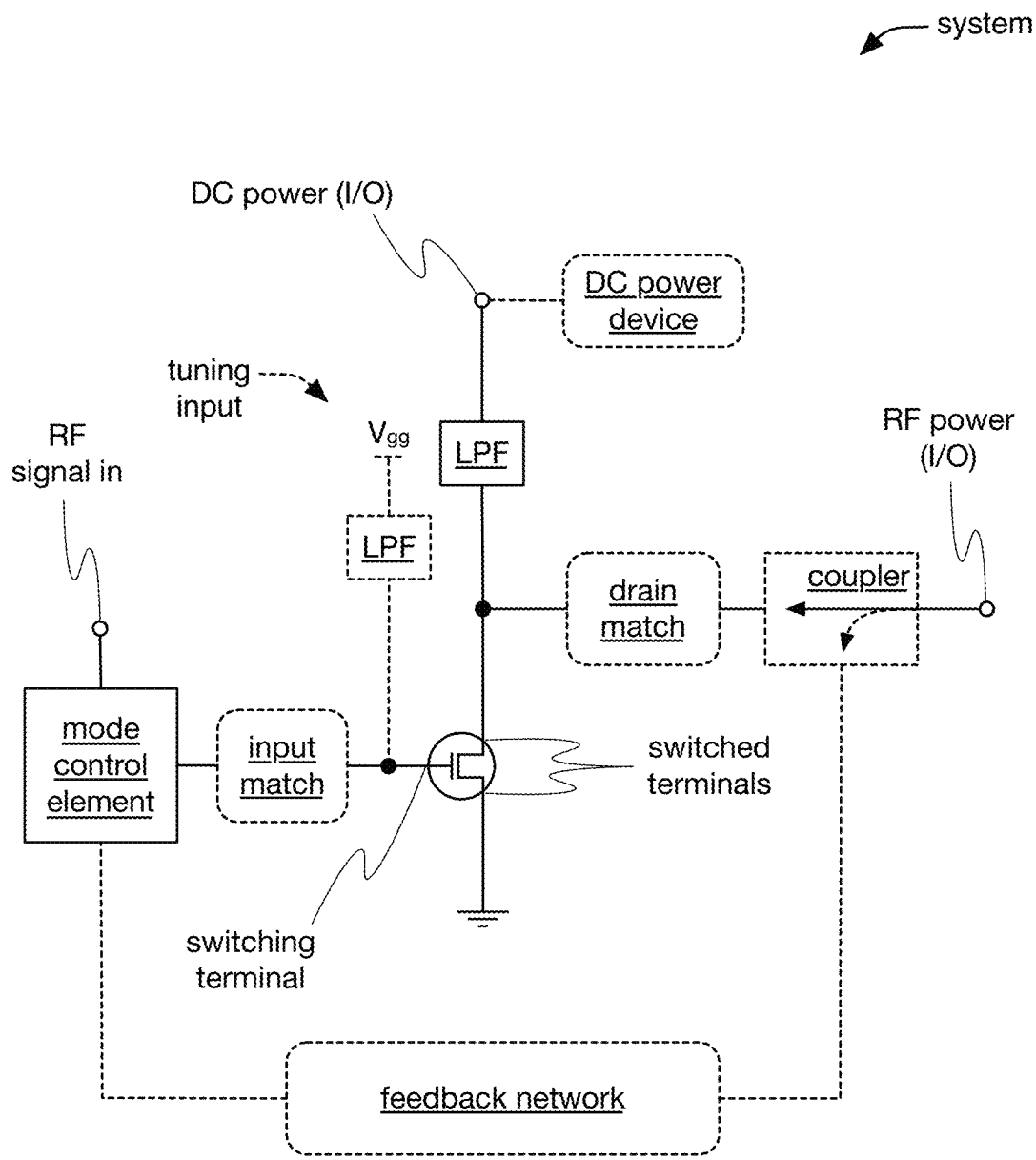
FIG. 7 is a schematic representation of an embodiment of the bidirectional RF circuit.

The circuit 100 preferably includes a mode control element, which can function to configure the circuit for operation (e.g., efficient operation, any operation, etc.) between the amplifier mode and the rectifier mode (e.g., wherein the mode control element controls which mode the circuit operates in and/or is configured to operate in. This mode control element is preferably electrically connected between the RF signal input and other elements of the circuit (e.g., as shown in FIG. 7), but can additionally or alternatively be connected in any other suitable manner. In examples, the mode control element can include a switch (e.g., the switch 120), an impedance network (e.g., the impedance network 170, such as a variable impedance network), a coupler (e.g., variable coupler electrically connected to the RF signal input), and/or any other suitable elements. However, the circuit can alternatively include no such mode control element, or the mode control element can have fixed, rather than variable, properties (e.g., wherein the RF signal input is electrically coupled to the other elements of the circuit by fixed circuit elements rather than variable, controllable, and/or configurable elements).

In some embodiments, the bidirectional RF circuit 100 defines a main path 101 and a feedback path 102. The main path is preferably used in both the amplifier and rectifier modes; the feedback path is preferably used in the amplifier mode, but not used in the amplifier mode (e.g., as shown in FIGS. 2A-2B). However, the circuit can additionally or alternatively define any other suitable circuit paths with any suitable functionality.

2.1 Terminals.

The terminals 110 preferably include an RF signal input 111, a DC power terminal 112, and an RF power terminal 113 (e.g., as shown in FIGS. 1, 2A, and/or 2B). However, the circuit 100 can additionally or alternatively include any other suitable terminals.

When the circuit is configured in the amplifier mode (e.g., as shown in FIG. 2A), the RF signal input 111 preferably functions as an input terminal for receiving the RF signal to be amplified by the circuit. When the circuit is configured in the rectifier mode (e.g., as shown in FIG. 2B), the RF signal input 111 is preferably disconnected from the circuit (and accordingly, the RF signal input preferably performs no function in the rectifier mode).

When the circuit is configured in the amplifier mode (e.g., as shown in FIG. 2A), the DC power terminal 112 preferably functions to receive DC power. When the circuit is configured in the rectifier mode (e.g., as shown in FIG. 2B), the DC power terminal preferably functions to output DC power from the circuit.

The circuit is preferably electrically coupled (e.g., connected) at the DC power terminal to one or more DC power devices (e.g., DC-powered loads and/or DC power supplies). For example, the circuit can be connected to one or more rechargeable batteries (and/or elements configured to be powered by the batteries and/or the circuit) operable to provide DC power to and/or receive DC power from the DC power terminal.

The DC power terminal is preferably electrically connected to the main path of the circuit. More preferably, the DC power terminal is electrically connected to the main path via a low-pass filter (e.g., inductive element) or bias tee (e.g., wherein the DC power terminal is arranged on the DC bias side of the tee). However, the DC power terminal can alternatively be connected to the circuit (e.g., to the main path) via a drain bias network and/or in any other suitable manner.

When the circuit is configured in the amplifier mode (e.g., as shown in FIG. 2A), the RF power terminal preferably functions to output an amplified RF signal from the circuit. When the circuit is configured in the rectifier mode (e.g., as shown in FIG. 2B), the RF power terminal preferably functions to receive RF power to be rectified. The circuit is preferably electrically coupled (e.g., connected) to one or more antennas (e.g., phased antenna array) via the RF power terminal.

However, the circuit can additionally or alternatively include any other suitable terminals.

2.2 Switch.

The switch 120 preferably functions to transition the system between the amplifier mode and rectifier mode. The switch 120 is preferably a single pole double throw (SPDT) switch. The switch is preferably operable to connect either the RF signal input 111 or the output of the feedback network 160 to the circuit (e.g., to the gate of the transistor 130), such as shown by way of example in FIGS. 2A-2B.

In the first switch position, in which the RF signal input 111 is connected to the circuit (e.g., as shown in FIG. 2A), the circuit is configured in the amplifier mode and is operable to amplify the RF input signal. In this configuration, the feedback path 102 is disconnected, and the feedback network 160 is preferably not used.

In a second switch position, in which the feedback network 160 is connected to the circuit (e.g., as shown in FIG. 2B), the circuit is configured in the rectifier mode and is operable to rectify the RF power input. In this configuration, the RF signal input 111 is disconnected and is not used.

Figure 5A:
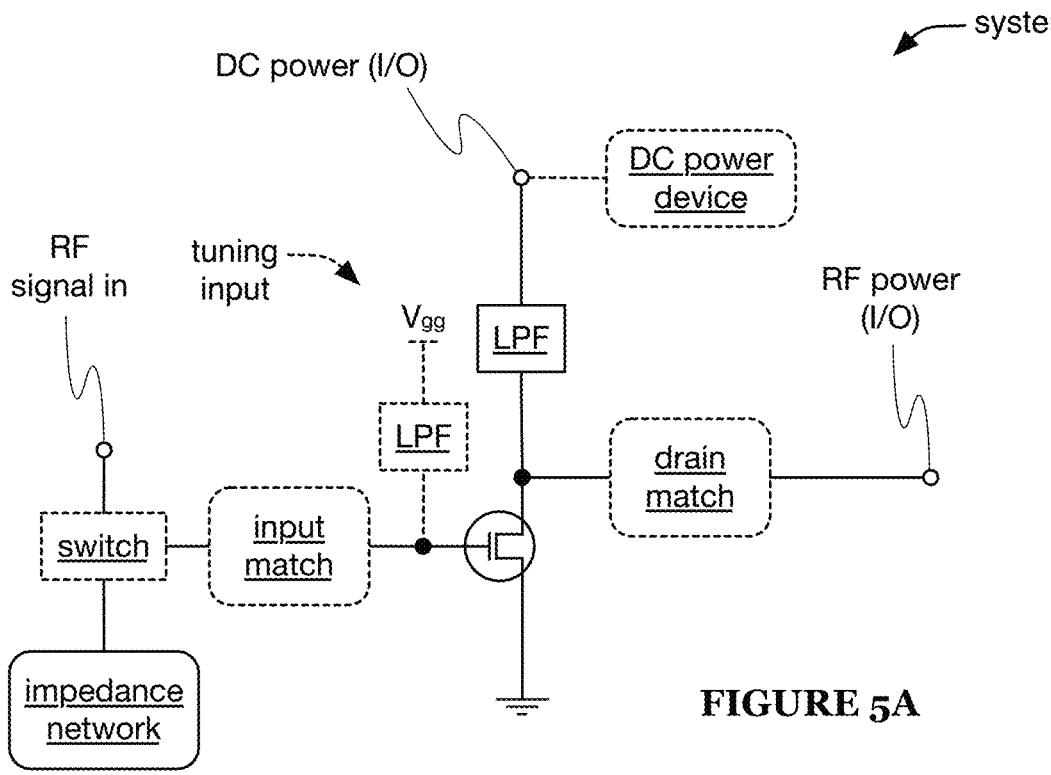
FIGS. 5A-5D are schematic representations of a first, second, third, and fourth variation, respectively, of the bidirectional RF circuit.

In some variations, the switch can alternatively be a single pole single throw (SPST) switch. For example, in variations in which the circuit does not include a feedback network 160, such as wherein an impedance network 170 is used in place of the feedback network, the system can optionally include a SPST switch (e.g., as shown in FIGS. 5D-5F) that functions to connect the RF signal input to the circuit (in the closed switch position, such as shown by way of example in FIG. 5E) and disconnect the RF signal input from the circuit (in the open switch position, such as shown by way of example in FIG. 5F).

In some variations, the circuit can additionally or alternatively include one or more non-switch elements configured to provide the functionality of the switch described herein (e.g., to configure or aid in configuring the system between the rectifier and amplifier modes). For example, the system can include a tunable transmission line (e.g., integrated into the input matching network), which can function to tune (or aid in tuning) gate matching for operation in the rectifier and amplifier modes (e.g., wherein the tuning of the tunable transmission line can be altered between rectifier mode operation and amplifier mode operation, thereby functioning to tune gate matching for operation in the desired mode, such as by optimizing gate matching for operation in the desired mode). In a specific example, the transmission line tuning can be altered by controlling one or more variable components (e.g., voltage controlled lumped components) arranged on and/or electrically coupled to the transmission line. However, the transmission line tuning can additionally or alternatively be controlled in any other suitable manner, and/or the system can additionally or alternatively include any other suitable non-switch elements configured to provide this functionality (or can include no such elements).

Figure 5B:
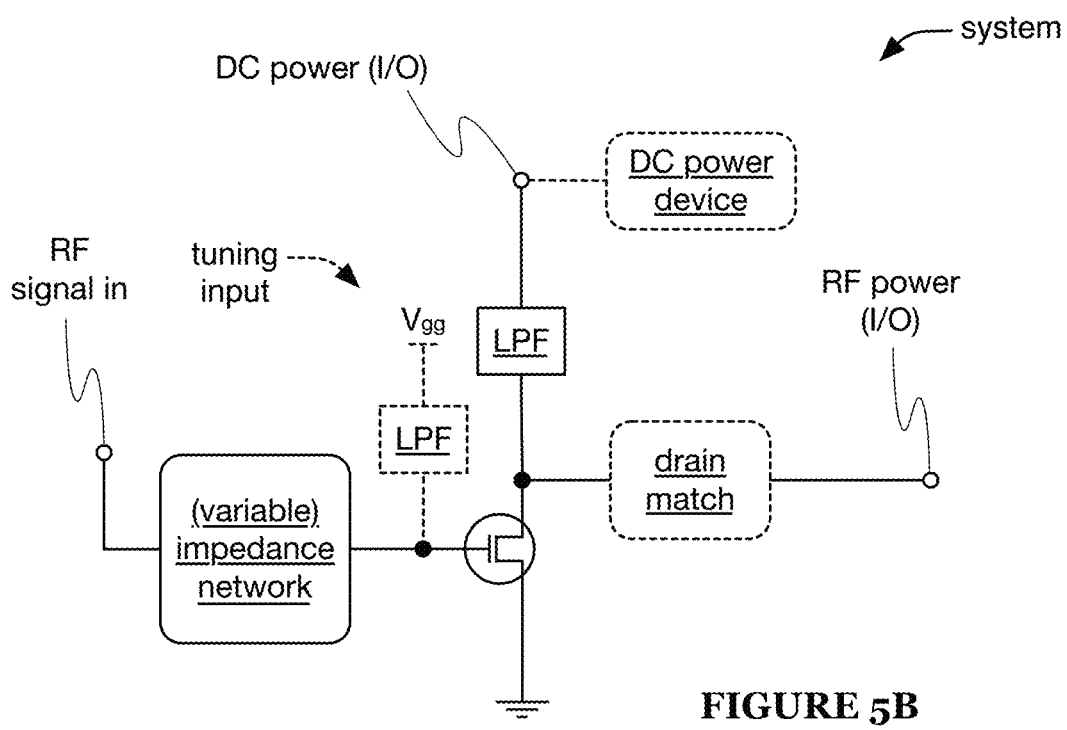
Figure 5C:
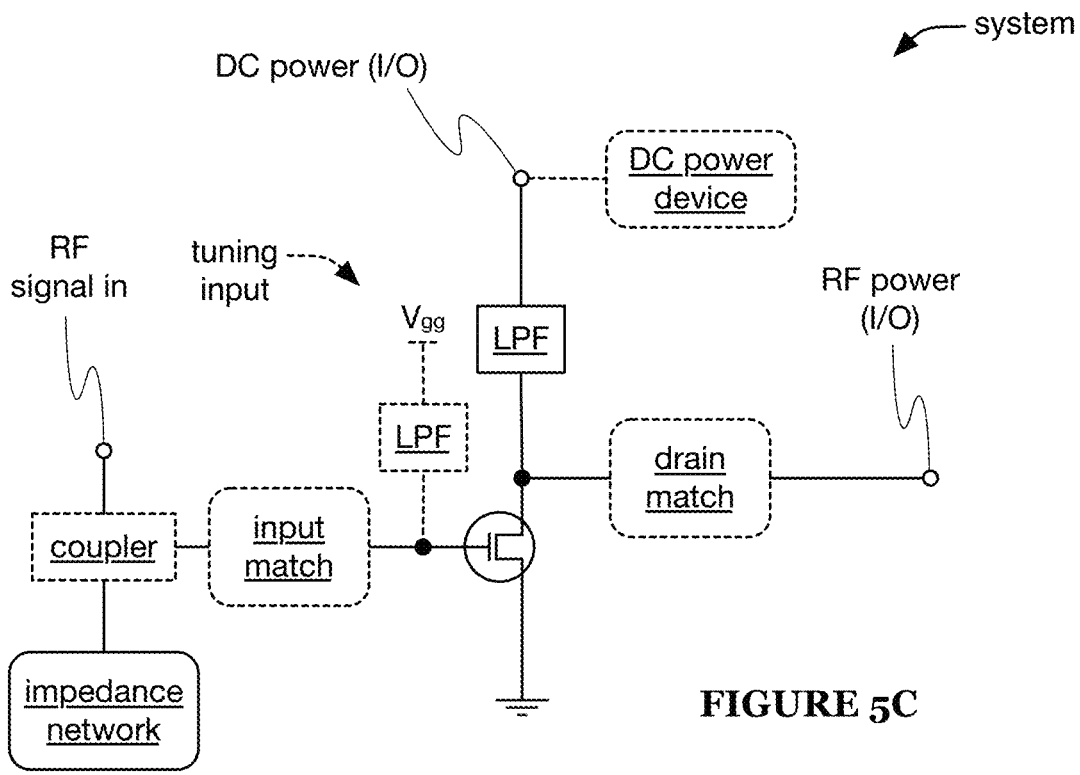
Figure 5D:
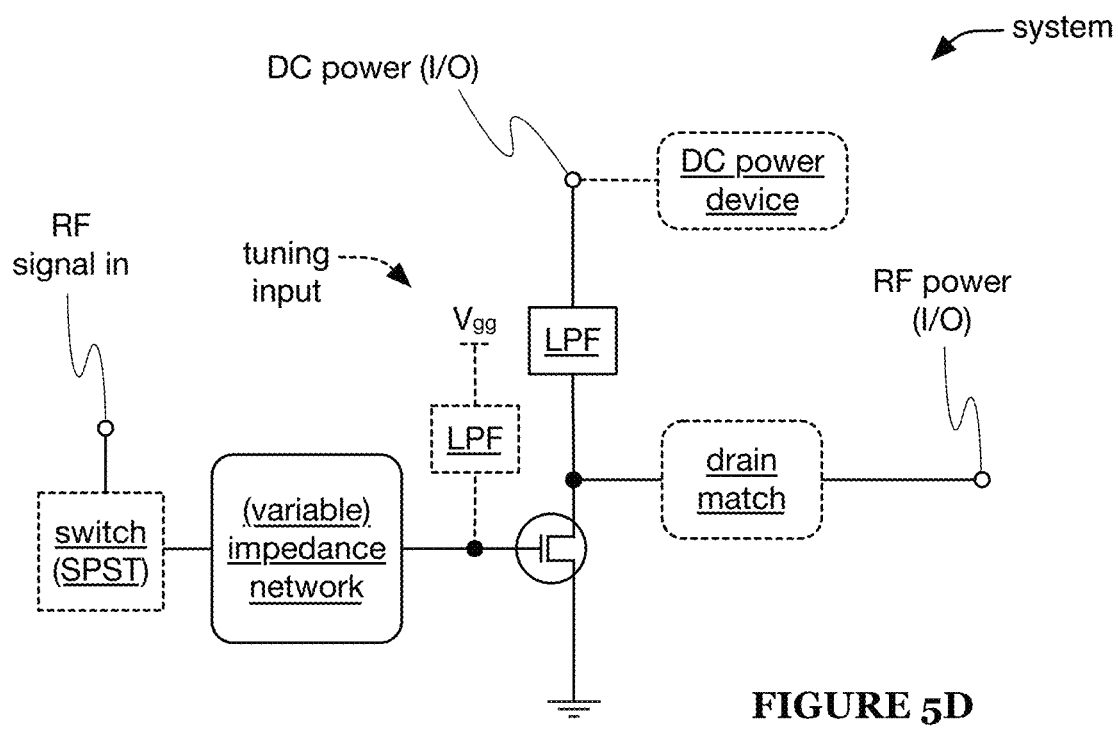
Figure 5E:
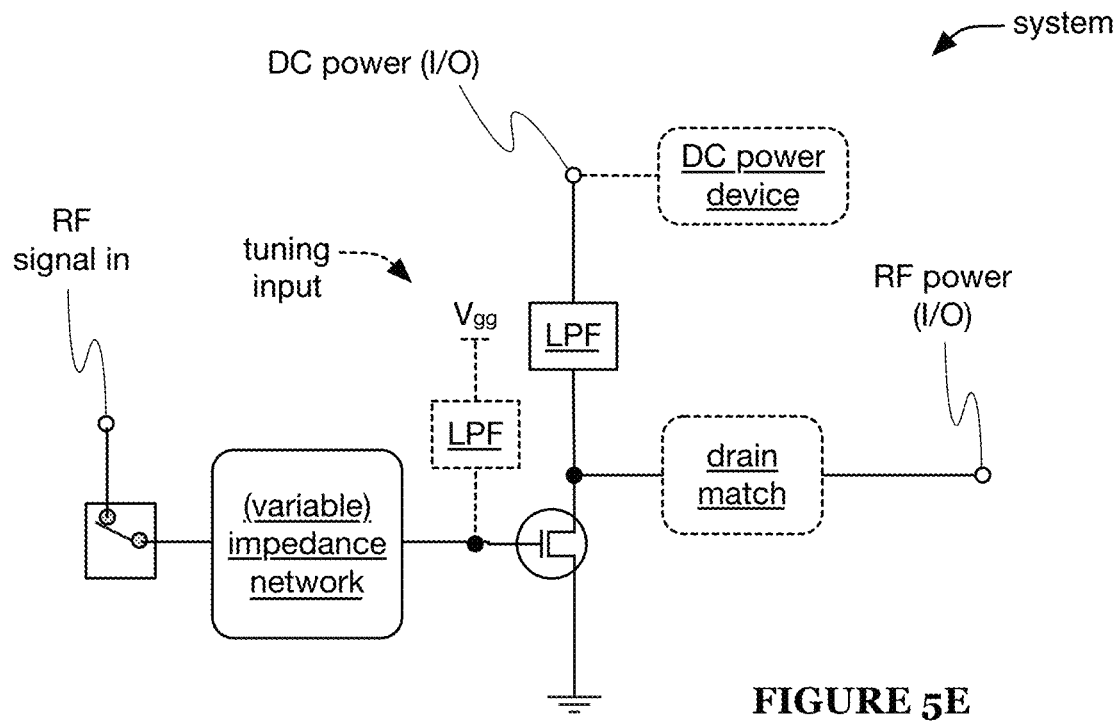
FIGS. 5E-5F are schematic representations of a specific example of the fourth variation of the bidirectional RF circuit, configured in a first and second mode, respectively.
Figure 5F:
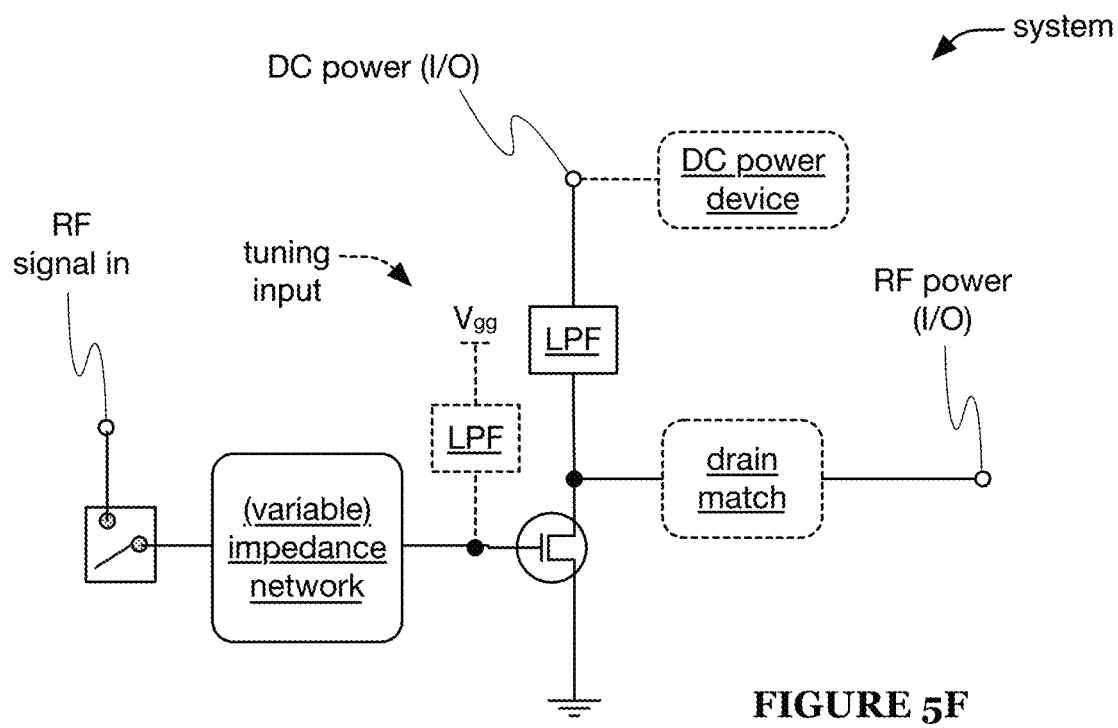

However, the circuit can additionally or alternatively include any other suitable switches, and/or can be operable to transition the circuit between the amplifier and rectifier modes (and/or any other suitable operation modes) in any other suitable manner (e.g., wherein the circuit may not include a switch 120, such as shown by way of example in FIG. 5B).

2.3 Transistor.

When the circuit is configured in the amplifier mode, the transistor preferably functions to modulate the DC power input based on the RF signal input. When the circuit is configured in the rectifier mode, the transistor preferably functions to modulate the RF power input based on feedback control (e.g., received from the feedback network).

The transistor is preferably a field-effect transistor (FET), such as a MOSFET (but alternatively a junction-gate FET (JFET) or any other suitable FET). However, the transistor can additionally or alternatively be any other transistor type (e.g., insulated-gate bipolar transistor (IGBT), bipolar junction transistor (BJT), etc.), and/or the circuit can include multiple transistors (of any suitable types) and/or any other suitable elements configured to provide analogous functionality. A person of skill in the art will recognize that, although the terminals of the transistor are referred to herein as the "gate", "source", and "drain", corresponding to embodiments in which the transistor is a FET, the terminals of a different type of transistor may be referred to by different names; in examples, such terminals could analogously be the "gate", "emitter", and "collector", respectively, of an IGBT, or the "base", "emitter", and "collector", respectively, of a BJT. In some instances, it may aid understanding to refer to each such terminal by a generic term that can apply regardless of the transistor type; for example, the "gate" of a FET or IGBT and the "base" of a BJT could each be referred to as a "switching terminal", while the other terminals could each be referred to as a "switched terminal".

The transistor gate is preferably electrically connected to the switch (e.g., optionally via an input matching network). The transistor source is preferably connected to ground. The transistor drain is preferably connected to the main path 101, more preferably connected between the drain matching network and the DC power terminal. For example, the circuit can include a bias tee that connects the drain, the drain matching network, and the DC power terminal (wherein the DC power terminal is on the DC bias side of the bias tee). Further, a person of skill in the art will recognize that an analogous circuit could be created in which the terminals of the transistor are reversed, such that the drain is connected to ground and the source is connected to the main path (wherein the 'drain matching network' could more appropriately be referred to as a 'source matching network').

However, the circuit can additionally or alternatively include any other suitable transistors in any suitable configuration.

2.4 Drain Matching Network.

The circuit can optionally include a drain matching network 140 (drain match), which can function to perform impedance matching at the transistor drain (e.g., to enable high-efficiency amplification and/or rectification). The drain matching network is preferably electrically coupled to the drain. (As described above, a person of skill in the art will recognize that the circuit could additionally or alternatively include an analogous source matching network connected to the transistor source in an analogous manner.)

The drain matching network is preferably harmonically terminated. For example, the drain matching network can define a harmonically terminated Class $F^{-1}$ topology. However, the drain matching network can additionally or alternatively define any other suitable match topology.

Further, the circuit can additionally or alternatively include any other drain matching network and/or can include no such network.

2.5 Coupler.

When the circuit is configured in the rectifier mode, the coupler 150 preferably functions to split the RF power input between the main path 101 and the feedback path 102. The coupler preferably couples only a small portion of the RF power input (e.g., −10 to −30 dB) onto the feedback path, while coupling the vast majority of the RF power input onto the main path. However, the coupler can additionally or alternatively exhibit any other suitable coupling ratio (e.g., substantially equal coupling, such as for a −3 dB coupler).

The coupling ratio can be fixed or variable. In examples in which the coupling ratio is variable, the ratio can be adjusted such as described below regarding the method 200 (e.g., regarding tuning rectifier operation, such as wherein the coupling ratio is treated as a tuning parameter for optimization); additionally or alternatively, when the circuit is configured in the amplifier mode, the coupling ratio can optionally be adjusted to minimize signal coupling onto the feedback path (e.g., can be set to zero, minimized, etc.).

The coupler 150 preferably exhibits minimal (e.g., no or substantially no) coupling from the main path to the feedback path. Accordingly, when the circuit is configured in the amplifier mode, the amplified RF signal output at the transistor drain (e.g., via the drain matching network) is preferably transmitted to the RF power terminal with minimal (e.g., no or substantially no) coupling onto the feedback path. However, the coupler can alternatively exhibit any suitable signal coupling from the main path to the feedback path. In one example, any signal coupled onto the feedback path while the circuit is configured in the amplifier mode may lead to reflection of the signal at the disconnected switch terminal; however, signal coupled into the feedback path while operating in the amplifier mode can additionally or alternatively have any other suitable result and/or be handled in any other suitable manner.

However, the circuit can additionally or alternatively include any other suitable couplers with any suitable properties. Alternatively, the circuit may not include a coupler 150 (e.g., in variations in which the circuit does not include a feedback network 160, such as wherein an impedance network 170 is used in place of the feedback network), such as shown by way of examples in FIGS. 5A, 5B, and/or 5D.

2.6 Feedback Network.

When the circuit is configured in the rectifier mode, the feedback network 160 preferably functions to enable tuning (e.g., optimization) of rectification efficiency. The feedback network preferably includes a feedback tuner 161, and can optionally include a driver amplifier 162.

The feedback tuner 161 preferably functions to control the phase and/or amplitude of the feedback signal. The feedback tuner preferably includes a phase shifter, which can enable optimization of the rectification efficiency. The phase shifter is preferably a variable phase shifter, more preferably enabling phase shift control over a full range of $2\pi$ radians (but alternatively over any suitable range). However, the phase shifter can alternatively have any other suitable properties.

The feedback tuner preferably includes a variable-gain amplifier (VGA), which can enable further optimization of rectification efficiency, such as by providing control over an additional parameter for optimization (e.g., as described below regarding the method 200, such as regarding 'tuning rectifier operation'). The VGA can additionally or alternatively function to compensate for losses, such as losses associated with the phase shifter.

The VGA is preferably arranged after the phase shifter along the feedback path (e.g., connected to an output of the phase shifter), but can alternatively be arranged before the phase shifter or have any other suitable arrangement.

In an alternative example, the feedback tuner can additionally or alternatively include a variable attenuator (e.g., in place of or in addition to the VGA), which can function to enable control of the overall gain of the feedback network (e.g., by controllably attenuating, rather than amplifying, the feedback signal, such as after or before a fixed amplification stage).

The feedback network can optionally include a driver amplifier 162, which can function to provide additional gain (e.g., a fixed amount of gain). The driver amplifier 162 is preferably arranged after the feedback tuner 161 along the feedback path (e.g., connected to an output of the feedback tuner), but can alternatively be arranged before the feedback tuner, or between elements of the feedback tuner (e.g., between the phase shifter and the VGA).

In an alternative embodiment, the feedback tuner can provide all or substantially all of the gain desired within the feedback network (e.g., wherein the feedback network does not include a driver amplifier). However, such an embodiment may require the use of a higher-power VGA, which (e.g., due to increased power requirements of the higher-power VGA, as compared with a comparable lower-power VGA followed by a fixed driver amplifier) can decrease the overall power efficiency of the rectifier and/or increase heat dissipation requirements.

However, the feedback network 160 can additionally or alternatively include any other suitable elements in any suitable arrangement. Alternatively, the circuit may not include a feedback network 160 (e.g., in variations in which an impedance network 170 is used in place of the feedback network 160), such as shown by way of examples in FIGS. 5A-5D.

2.7 Impedance Network.

In some variations, the circuit can include one or more impedance networks 170, which can function as a synchronous drive for the transistor 130 (e.g., in the rectifier mode). Further, in some examples, the impedance network 170 can optionally function to perform input matching in the amplifier mode (e.g., in place of an input matching network 180).

In variations in which the circuit includes an impedance network 170 instead of a feedback network (e.g., as shown in FIGS. 5A-5D), when operated in the rectifier mode, a (preferably small) portion of the RF input may leak through the transistor 130 and out the transistor gate (or analogously, the transistor base). In such variations, this leakage current can reach the impedance network 170, reflecting off it and returning to the transistor gate, where it can function to control transistor operation. Accordingly, the impedance network is preferably configured to present an appropriate impedance such that this reflected leakage current drives the transistor in a manner that results in efficient rectification of the RF input (e.g., turning off the transistor when the RF input is high, and turning on the transistor when the RF input is low).

In some examples, the impedance network presents a fixed (or substantially fixed) impedance (i.e., the impedance network is a fixed impedance network). For example, the impedance network can include fixed-value electrical elements (e.g., resistive, inductive, and/or capacitive elements, such as defining a fixed RLC network).

In other examples, the impedance network can present a variable (e.g., controllable) impedance (i.e., the impedance network is a variable impedance network, which may be switchable, tunable, and/or otherwise controllable). In a first specific example, the impedance network includes one or more tunable elements (e.g., tunable resistive, inductive, and/or capacitive elements, in addition to and/or instead of fixed-value elements, such as defining a variable RLC network). In a second specific example, the impedance network includes a (switchable) bank of impedance networks (preferably fixed impedance networks but additionally or alternatively tunable impedance networks and/or any other suitable networks) having different properties (e.g., presenting different impedances), wherein the bank can be controlled to present one or more of the different impedance networks contained therein. Accordingly, the second example of the impedance network can function to control the impedance it presents (e.g., to optimize circuit operation under various circumstances).

In a first variation, the impedance network is arranged opposing the RF signal input 111 across the switch 120 (e.g., wherein the switch is operable to electrically connect either the RF signal input 111 or the impedance network 170 to the circuit, such as to the gate of the transistor 130), such as shown by way of example in FIG. 5A. In this variation, the impedance network can be a fixed or variable impedance network. In an alternate example of this first variation, the switch is replaced by a coupler (e.g., wherein the coupler electrically couples both the RF signal input 111 and the impedance network 170 to the circuit, such as to the gate of the transistor 130), such as shown byway of example in FIG. 5C; in variations of this example, the coupler can be a fixed coupler, variable coupler, or any other suitable coupler.

In a second variation, the impedance network can be arranged in the circuit between the RF signal input and the gate of the transistor 130 (e.g., in place of the switch 120 and/or the input matching network 180), such as shown by way of example in FIG. 5B. In this variation, the impedance network is preferably a variable impedance network (e.g., tunable, switchable, and/or otherwise controllable). When the circuit operates in the rectifier mode, the impedance network is preferably controlled to function as a synchronous drive (e.g., as described above). When the circuit operates in the amplifier mode, the impedance network is preferably controlled to function as an input match (e.g., analogous to the input matching network 180 described below). However, the impedance network can additionally or alternatively be controlled in any other suitable manner, or, in an alternate embodiment, can be a fixed impedance network and/or any other suitable network. In an alternate example of this second variation, the circuit includes a switch (e.g., SPST switch) arranged between the RF signal input and the impedance network (e.g., as shown in FIGS. 5D-5F). This switch preferably functions to control whether the RF signal input is electrically coupled to the impedance network (e.g., wherein the switch can be closed in the rectifier mode to couple the RF signal input to the impedance network, such as shown in FIG. 5E, and can be open in the amplifier mode to prevent coupling of the RF signal input to the impedance network, such as shown in FIG. 5F).

However, the circuit can additionally or alternatively include any other suitable impedance network in any suitable arrangement (or can include no such network).

2.8 Input Matching Network.

The circuit can optionally include an input matching network 180, which can function to enable a high small-signal gain at the transistor gate. The input matching network is preferably electrically coupled to the gate, such as being coupled between the switch 120 and the gate.

The input matching network 180 can have any suitable topology for providing RF impedance matching to the gate. The input matching network is preferably a tunable input match, but can additionally or alternatively have any other suitable properties. In one example, the input matching network includes Class $F^{-1}$ harmonic terminations.

However, the circuit can additionally or alternatively include any other suitable input matching network 180 and/or can include no such network.

2.9 Tuning Input.

The circuit can optionally include a tuning input, which can function to enable optimization of circuit efficiency in the rectifier and/or amplifier modes. The tuning input preferably enables application of a gate bias $V_{gg}$ (preferably, a DC or substantially constant gate bias, but alternatively any other suitable bias).

The tuning input is preferably electrically connected to the transistor gate, more preferably connected via a low-pass filter or a bias tee. For example, the circuit can include a bias tee that connects the tuning input (on the DC bias side of the bias tee) between the gate and the switch (e.g., between the gate and the input matching network in embodiments in which the circuit includes an input matching network). However, the tuning input can alternatively be connected to the transistor gate via a gate bias network and/or in any other suitable manner.

Further, the circuit can additionally or alternatively include any other suitable tuning inputs electrically connected to any suitable elements of the circuit.

2.10 Integrations.

In some embodiments, the circuit 100 can include and/or be coupled to (e.g., electrically coupled to) one or more elements such as described in U.S. patent application Ser. No. 17/528,869, filed 17 Nov. 2021 and titled "SYSTEM AND METHOD FOR WIRELESS POWER RECEPTION", and/or in U.S. patent application Ser. No. 17/500,652, filed 13 Oct. 2021 and titled "METHOD AND SYSTEM FOR WIRELESS POWER DELIVERY", each of which is herein incorporated in its entirety by this reference; for example, the circuit 100 can function as an element of a transmitter and/or receiver (e.g., of a node configured to operate as both a transmitter and receiver) of U.S. patent application Ser. No. 17/528,869 and/or U.S. patent application Ser. No. 17/500,652.

In one embodiment, the circuit 100 is coupled to (e.g., integrated with) a node of a wireless power mesh network operable to switch between a transmission mode and a receiving mode. The node preferably includes one or more antennas (e.g., phased antenna array) electrically coupled (e.g., connected) to the RF power terminal, one or more DC power devices (e.g., DC-powered loads and/or DC power supplies, such as described above regarding the DC power terminal 112) electrically coupled (e.g., connected) to the DC power terminal, and a controller configured to control operation of the circuit 100. In examples, the controller can be configured to control the circuit operation mode (e.g., by controlling the switch position), to control some or all of the tuning input(s) and/or variable circuit components, to provide an RF signal input, and/or to control circuit operation in any other suitable manner. In this embodiment, the circuit 100 can be operable to function as an amplifier when the node operates as a transmitter (e.g., amplifying an RF signal to be transmitted by the node), and can be operable to function as a rectifier when the node operates as a receiver (e.g., rectifying RF power received by the node).

However, the circuit 100 can additionally or alternatively include any other suitable elements in any suitable arrangement, have any other suitable functionalities, and/or be integrated with any other suitable system(s) in any suitable manner.

3. Method.

The method 200 is preferably performed using the bidirectional RF circuit 100 described above. However, the method can additionally or alternatively be performed using any other suitable system.

3.1 Operating in an Amplifier Mode.

Figure 6A:
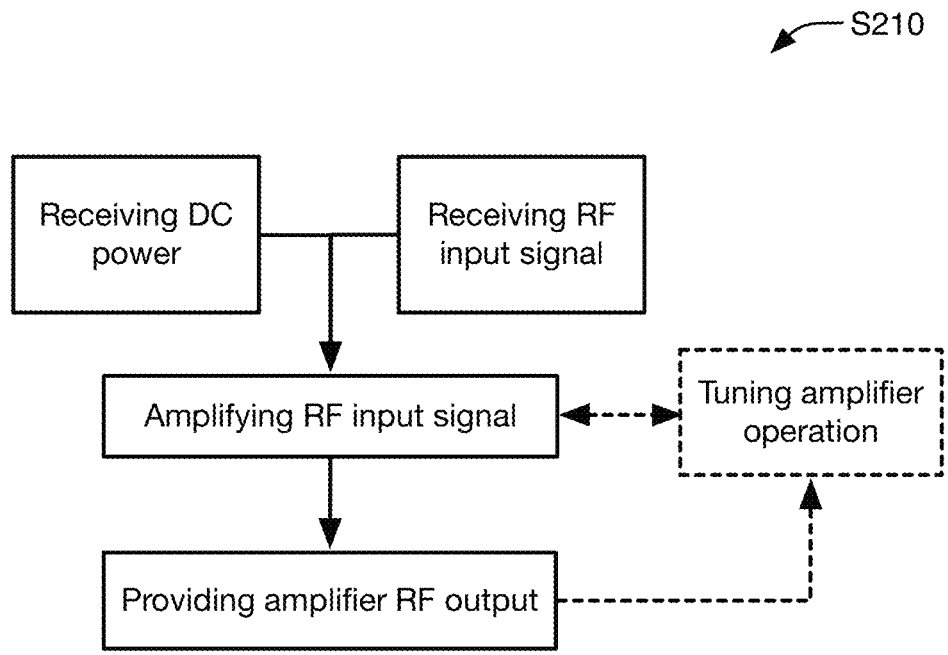
FIGS. 6A-6B are schematic representations of examples of a first and second portion, respectively, of the method.

Operating in the amplifier mode S210 preferably includes receiving DC power (e.g., at a DC power terminal), receiving an RF input signal (e.g., at an RF signal input), amplifying the RF input signal (e.g., using the circuit 100 configured in the amplifier mode), and providing the amplified RF output (e.g., at an RF power terminal), such as shown by way of example in FIG. 6A. S210 can optionally include tuning amplifier operation.

Tuning amplifier operation can be performed by adjusting the gate bias, adjusting one or more matching networks (e.g., input matching network, drain matching network, etc.), and/or adjusting any other suitable variable elements of the circuit. Tuning amplifier operation preferably includes optimizing amplifier efficiency (e.g., measuring the output and/or input power and maximizing the ratio thereof, such as maximizing the output power for a given input power). The amplifier operation can be tuned periodically, tuned in response to detection of a substantial change in one or more input metrics (e.g., substantial increase or decrease in DC power input drain bias, substantial change in RF input signal characteristics, etc.), and/or tuned with any other suitable timing.

However, S210 can additionally or alternatively include operating in the amplifier mode in any other suitable manner.

3.2 Operating in a Rectifier Mode.

Figure 6B:
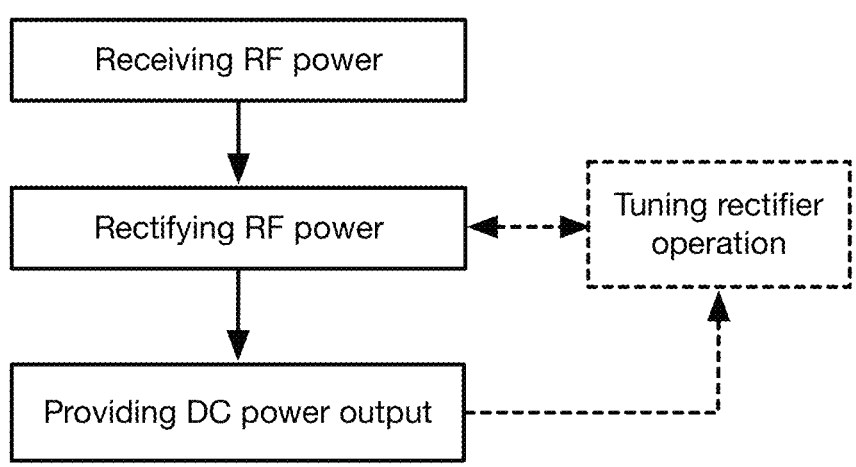

Operating in a rectifier mode S220 preferably includes receiving RF power (e.g., at an RF power terminal), rectifying the RF power, and providing the rectified power as a DC power output (e.g., at a DC power terminal), such as shown by way of example in FIG. 6B. S220 can optionally include tuning rectifier operation.

Tuning rectifier operation can be performed by adjusting the gate bias, adjusting the feedback network (e.g., adjusting the phase shifter and/or the VGA), adjusting one or more matching networks (e.g., input matching network, drain matching network, etc.), and/or adjusting any other suitable variable elements of the circuit. Tuning rectifier operation preferably includes optimizing rectifier efficiency (e.g., measuring the output and/or input power and maximizing the ratio thereof, such as maximizing the output power for a given input power).

In one example, tuning rectifier operation includes optimizing gate bias (e.g., by performing a line search), then optimizing feedback network parameters (e.g., performing an optimum search over a two-dimensional parameter space defined by the feedback tuner phase shifter and VGA), optionally followed by re-optimizing the gate bias (e.g., by performing a new line search) under the optimized feedback network conditions. In variations, this iterative optimization approach can be repeated for any suitable number of iterations. However, the tuning parameters can additionally or alternatively be optimized in any other suitable manner.

The rectifier operation can be tuned periodically, tuned in response to detection of a substantial change in one or more input metrics (e.g., substantial increase or decrease in RF input power), and/or tuned with any other suitable timing.

However, S220 can additionally or alternatively include operating in the rectifier mode in any other suitable manner.

3.3 Transitioning Between Operation Modes.

Transitioning between operation modes S230 preferably includes changing the switch configuration. S230 can include transitioning to the amplifier mode by configuring the switch to connect the RF signal input to the circuit, or can include transitioning to the rectifier mode by configuring the switch to connect the feedback path to the circuit.

In some variations (e.g., variations in which a controllable impedance network is arranged in the circuit between the RF signal input and the gate of the transistor, such as arranged in place of the switch and/or the input matching network), S230 can additionally or alternatively include controlling the impedance network based on the desired operation mode (e.g., as described above regarding the impedance network 170). S230 can include transitioning to the amplifier mode by configuring the impedance network to function as an input match, or can include transitioning to the rectifier mode by configuring the impedance network to function as a synchronous drive (e.g., rather than or in addition to configuring a switch as described above).

Additionally or alternatively, S230 can include controlling one or more tuning elements (e.g., element configured to apply a gate bias $V_{gg}$, such as a DC gate bias, to the transistor gate) based on the desired operation mode. For example S230 can include switching to a first gate bias (or bias within a first range of gate biases) as part of the transition to the amplifier mode, or switching to a second gate bias (or bias within a second range of gate biases) as part of the transition to the rectifier mode.

However, S230 can additionally or alternatively include transitioning between operation modes in any other suitable manner, and/or the method 200 can additionally or alternatively include any other suitable elements performed in any suitable manner.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A method comprising, at a bidirectional circuit:
    during an amplification time period:
        receiving an RF input signal at an RF signal input terminal;
        receiving a DC power input at a DC terminal;
        generating an amplified signal based on the RF signal input; and
        providing the amplified signal at an RF power terminal; and
    during a rectification time period:
        receiving an RF power input at the RF power terminal;
        rectifying the RF power input to generate a DC power output; and
        providing the DC power output at the DC terminal;
    wherein the amplification time period does not overlap with the rectification time period.

2. The method of claim 1, wherein the amplification time period precedes the rectification time period, the method further comprising, between the amplification time period and the rectification time period, switching bidirectional circuit operation from an amplification mode to a rectification mode.

3. The method of claim 2, further comprising:
    after the rectification time period, switching bidirectional circuit operation from the rectification mode to the amplification mode; and
    after switching bidirectional circuit operation from the rectification mode to the amplification mode, at the bidirectional circuit:
        receiving a second RF input signal at the RF signal input terminal;
        receiving a second DC power input at the DC terminal;
        generating a second amplified signal based on the second RF signal input; and
        providing the second amplified signal at the RF power terminal.

4. The method of claim 1, further comprising, during the rectification time period, controlling a variable impedance network of the bidirectional circuit to function as a synchronous drive for a transistor of the bidirectional circuit.

5. The method of claim 4, further comprising, during the amplification time period, at the variable impedance network, performing impedance matching between the RF signal input terminal and a switching terminal of the transistor.

6. The method of claim 5, wherein:
    during the amplification time period, a switch of the bidirectional circuit electrically couples the RF signal input terminal to the variable impedance network; and
    during the rectification time period, the switch does not electrically couple the RF signal input terminal to the variable impedance network.

7. The method of claim 6, wherein the rectification time period precedes the amplification time period, the method further comprising, between the rectification time period and the amplification time period:
    configuring the switch to electrically couple the RF signal input terminal to the variable impedance network; and
    configuring the variable impedance network to performing impedance matching between the RF signal input terminal and the switching terminal.

8. The method of claim 4, further comprising, during at least one of the amplification time period or the rectification time period, tuning bidirectional circuit operation by providing a bias voltage to the switching terminal of the transistor.

9. The method of claim 8, wherein the bias voltage is provided to the switching terminal via a low-pass filter.

10. The method of claim 1, wherein:
    the bidirectional circuit further comprises a directional coupler, an impedance network, an input match, and a transistor;
    the input match electrically couples the directional coupler to a switching terminal of the transistor; and
    the method further comprises, during the amplification time period and the rectification time period, at the directional coupler, electrically coupling the RF signal input terminal, the impedance network, and the input match.

11. The method of claim 10, wherein the impedance network presents a substantially fixed impedance throughout the amplification time period and the rectification time period.

12. The method of claim 10, wherein:
    the amplification time period precedes the rectification time period;
    the directional coupler defines a coupling ratio between the RF signal input terminal and the input match;
    the method further comprises, between the amplification time period and the rectification time period, switching bidirectional circuit operation from an amplification mode to a rectification mode by configuring the directional coupler to alter the coupling ratio.

13. The method of claim 12, wherein:
    during the amplification time period, the coupling ratio has a first value; and
    during the rectification time period, the coupling ratio has a second value substantially less than the first value.

14. The method of claim 1, wherein:
    the bidirectional circuit further comprises a switch, an input match, and a transistor;
    the input match electrically couples the switch to a switching terminal of the transistor;
    during the amplification time period, the switch electrically couples the RF signal input terminal to the input match; and
    during the rectification time period, the switch does not electrically couple the RF signal input terminal to the input match.

15. The method of claim 14, wherein:
    the bidirectional circuit further comprises a directional coupler and a feedback network;

the directional coupler is electrically coupled between the RF power terminal, a switched terminal of the transistor, and the feedback network;

the feedback network electrically couples the directional coupler to the switch; and during the rectification time period, the switch electrically couples the feedback network to the input match.

16. The method of claim 15, further comprising, during the rectification time period:

at the directional coupler, coupling a portion of the RF power input into the feedback network;

at the feedback network, modifying the portion of the RF power input by performing at least one of: phase shifting, amplifying, or attenuating; and providing the modified portion of the RF power input to the input match.

17. The method of claim 16, wherein:

the feedback network comprises a feedback tuner comprising a variable phase shifter; and modifying the portion of the RF power input comprises phase shifting the portion of the RF power input.

18. The method of claim 17, wherein the feedback tuner further comprises a variable-gain amplifier; and modifying the portion of the RF power input further comprises amplifying the portion of the RF power input.

19. The method of claim 18, wherein the feedback network further comprises a power amplifier electrically coupled between the feedback tuner and the switch.

20. The method of claim 15, wherein:

the amplification time period precedes the rectification time period; and the method further comprises, between the amplification time period and the rectification time period, switching bidirectional circuit operation from an amplification mode to a rectification mode by configuring the switch to electrically couple the feedback network to the input match and to not electrically couple the RF signal input terminal to the input match.

* * * * *